United States Patent
Doron et al.

(10) Patent No.: US 10,026,500 B2
(45) Date of Patent: Jul. 17, 2018

(54) ADDRESS TRANSLATION STIMULI GENERATION FOR POST-SILICON FUNCTIONAL VALIDATION

(71) Applicant: International Business Machines Corporation, Armonk, NY (US)

(72) Inventors: Shai Doron, Meggido (IL); Anatoly Koyfman, Kiriat Yam (IL)

(73) Assignee: International Business Machines Corporation, Armonk, NY (US)

( * ) Notice: Subject to any disclaimer, the term of this patent is extended or adjusted under 35 U.S.C. 154(b) by 92 days.

(21) Appl. No.: 14/940,277

(22) Filed: Nov. 13, 2015

(65) Prior Publication Data

US 2017/0140839 A1    May 18, 2017

(51) Int. Cl.
| | |
|---|---|
| *G11C 29/34* | (2006.01) |
| *G06F 11/26* | (2006.01) |
| *G06F 11/273* | (2006.01) |
| *G06F 11/16* | (2006.01) |
| *G06F 12/10* | (2016.01) |
| *G06F 11/263* | (2006.01) |

(52) U.S. Cl.
CPC .......... *G11C 29/34* (2013.01); *G06F 11/1666* (2013.01); *G06F 11/261* (2013.01); *G06F 11/263* (2013.01); *G06F 11/2733* (2013.01); *G06F 12/10* (2013.01)

(58) Field of Classification Search
CPC .... G11C 29/34; G06F 11/1666; G06F 11/261; G06F 11/263; G06F 11/2733; G06F 12/10
USPC ..... 714/738, 728, 724, 734, 742, 32, 29, 42; 716/106, 111; 711/206, 202; 703/14
See application file for complete search history.

(56) References Cited

U.S. PATENT DOCUMENTS

| | | | |
|---|---|---|---|
| 7,370,296 B2 * | 5/2008 | Koyfman | G06F 11/2257 714/E11.157 |
| 7,752,006 B2 * | 7/2010 | Copty | G06F 11/263 702/108 |
| 7,788,610 B2 * | 8/2010 | Emek | G06F 17/5022 716/106 |
| 7,917,348 B2 | 3/2011 | Devins et al. | |

(Continued)

OTHER PUBLICATIONS

Kadry et al., "Improving Post-silicon Validation Efficiency by Using Pre-generated Data", V. Bertacco and A. Legay (Eds.): HVC 2013, LNCS 8244, pp. 166-181.

*Primary Examiner* — John T Tabone, Jr.
(74) *Attorney, Agent, or Firm* — Robert C. Bunker

(57) ABSTRACT

A method for generating address translation stimuli for post-silicon functional validation is provided. The method includes determining a plurality of memory configurations based on a plurality of translation tables used by a stimuli generator to solve a plurality of test templates, providing a test template from the plurality of test templates, selecting a memory configuration from the plurality of memory configurations based on the test template, a memory variable, and a set of testing parameters, identifying a translation table from the plurality of translation tables based on the test template, allocating a memory space for the translation table, and executing the test template on the stimuli generator based on the translation table, the memory space, and the set of testing parameters.

20 Claims, 5 Drawing Sheets

(56) References Cited

U.S. PATENT DOCUMENTS

| | | | | |
|---|---|---|---|---|
| 8,245,164 | B2* | 8/2012 | Katz | G06F 11/263 |
| | | | | 716/103 |
| 8,543,368 | B1* | 9/2013 | Sznajder | G01R 31/318357 |
| | | | | 703/14 |
| 8,892,386 | B2* | 11/2014 | Adir | G06F 11/263 |
| | | | | 702/117 |
| 2005/0278702 | A1* | 12/2005 | Koyfman | G06F 11/263 |
| | | | | 717/124 |
| 2007/0011631 | A1* | 1/2007 | Fine | G01R 31/318357 |
| | | | | 716/105 |
| 2008/0209160 | A1* | 8/2008 | Katz | G06F 11/263 |
| | | | | 711/206 |
| 2008/0319729 | A1* | 12/2008 | Copty | G06F 11/263 |
| | | | | 703/17 |
| 2009/0319961 | A1* | 12/2009 | Katz | G06F 11/263 |
| | | | | 716/103 |
| 2011/0087861 | A1 | 4/2011 | Bertacco et al. | |
| 2014/0344785 | A1* | 11/2014 | Bilgory | G06F 11/3684 |
| | | | | 717/124 |

* cited by examiner

ADDRESS TRANSLATION STIMULI GENERATION FOR POST-SILICON FUNCTIONAL VALIDATION

BACKGROUND

The present invention generally relates to testing semiconductor integrated circuits, and more particularly to generating address translation stimuli for post-silicon functional validation.

Post-silicon functional validation may be one of the final steps in testing the functionality of a semiconductor integrated circuit. Validation of post-silicon platforms may be performed with an exerciser, which may be loaded onto a device under testing (DUT). An exerciser generates test cases (e.g., programs, stimuli), executes the test cases (e.g., on the DUT), and checks the results. The stimuli generation component (e.g., stimuli generator, stimuli generation engine) in an exerciser should be kept simple due to limited hardware resource.

Some complex DUT areas, however, require heavy computation to produce interesting events and coverage. For such areas, external off-line stimuli generators may be utilized. An example of a complex DUT area is an address translation facility in a memory management unit, which may consist of numerous microarchitecture details and may require a dedicated off-line stimuli generator that may be significantly more complex than stimuli generators used for other DUT areas. In addition, a post-silicon exerciser may restrict the address translation stimuli generator due to limited hardware resources, e.g., memory. As a result, the address translation stimuli generator may not produce the desired stimuli in a reliable, consistent manner.

Typically, an address translation stimuli generator may utilize a constrained-random constrain satisfaction problem (CSP) solving engine (solver). However, since the post-silicon test environment may have limited memory, a generic CSP solver faces significant difficulties in finding solutions as memory space for translation tables is also limited.

SUMMARY

According to one embodiment, a method for generating address translation stimuli for post-silicon functional validation is provided. The method may include determining a plurality of memory configurations associated with a plurality of test templates based on the plurality of translation tables used by a stimuli generator to solve a plurality of test templates, providing a test template from the plurality of test templates, selecting a memory configuration from the plurality of memory configurations based on the test template, a memory variable, and a set of testing parameters, identifying a translation table from the plurality of translation tables based on the test template, allocating a memory space for the translation table, and executing the test template on the stimuli generator based on the translation table, the memory space, and the set of testing parameters.

According to another embodiment, a computer program product for generating address translation stimuli for post-silicon functional validation is provided. The computer program product may include at least one computer readable non-transitory storage medium having computer readable program instructions for execution by a processor. The computer readable program instructions include instructions for determining a plurality of memory configurations based on a plurality of translation tables used by a stimuli generator to solve a plurality of test templates, providing a test template from the plurality of test templates, selecting a memory configuration from the plurality of memory configurations based on the test template, a memory variable, and a set of testing parameters, identifying a translation table from the plurality of translation tables based on the test template, allocating a memory space for the translation table, and executing the test template on the stimuli generator based on the translation table, the memory space, and the set of testing parameters.

According to another embodiment, a computer system for generating address translation stimuli for post-silicon functional validation is provided. The system may include at least one processing unit, at least one computer readable memory, at least one computer readable tangible, non-transitory storage medium, and program instructions stored on the at least one computer readable tangible, non-transitory storage medium for execution by the at least one processing unit via the at least one computer readable memory. The program instructions include instructions for determining a plurality of memory configurations based on a plurality of translation tables used by a stimuli generator to solve a plurality of test templates, providing a test template from the plurality of test templates, selecting a memory configuration from the plurality of memory configurations based on the test template, a memory variable, and a set of testing parameters, identifying a translation table from the plurality of translation tables based on the test template, allocating a memory space for the translation table, and executing the test template on the stimuli generator based on the translation table, the memory space, and the set of testing parameters.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Various embodiments of the present invention will now be discussed with reference to FIGS. 1-5, like numerals being used for like and corresponding parts of the various drawings.

According to one embodiment, provided is a method for generating address translation stimuli for post-silicon functional validation by determining a plurality of memory configurations for a stimuli generator, providing a test template to the stimuli generator, selecting a memory configuration based on the test template, a memory variable, and a set of testing parameters, identifying a translation table based on the test template, allocating a memory space for the translation table, and executing the test template on the stimuli generator based on the translation table, the memory space, and the set of testing parameters. In one embodiment, a dedicated memory manager may select an appropriate (e.g., optimal) memory configuration based on the test template and may allocate memory space for translation tables, as necessary, based on the memory variable (e.g., available memory) and a set of testing parameters (e.g., DUT testing knowledge and testing environment variables). A dedicated memory manager (e.g., a memory manager module) may improve stimuli generation (in terms of efficiency, success, quantity, complexity, etc.), particularly, in post-silicon validation scenarios with limited available memory for such testing.

The plurality of memory configurations are associated with the plurality of test templates, and are based on a plurality of translation tables used by the stimuli generator to solve the plurality of test templates. Determining the plurality of memory configurations may occur during a preliminary validation phase. Providing a predetermined memory configuration associated with a particular test template (e.g., based on a particular set of translation tables used by the stimuli generator to solve the test template during the preliminary validation phase) may improve stimuli generation success rates, and in particular, with respect to the generation of complex, interesting events.

The method, computer program products, and systems disclosed herein may improve the generation of stimuli necessary to test complex areas of a DUT, and in particular, when resources (e.g., memory) are limited by determining, e.g., during a preliminary phase, a plurality of memory configurations associated with test templates executed on a given stimuli generator, and allocating a memory space for a translation table that the stimuli generator may use to execute a given test template based on the memory constraints and testing parameters associated with the DUT and the testing environment.

Figure 1:
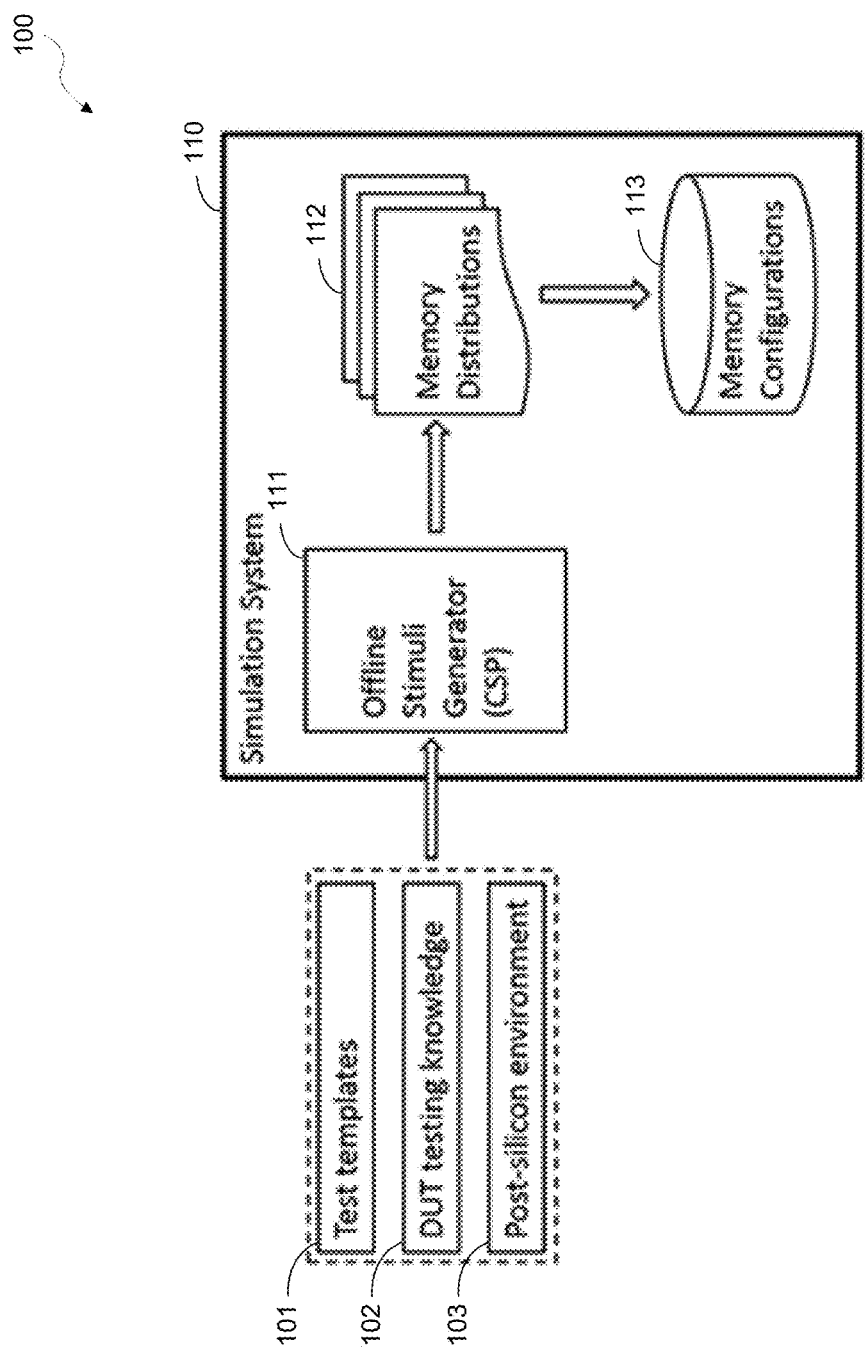
FIG. 1 is a block diagram illustrating an exemplary preliminary aspect of a method for generating address translation stimuli for post-silicon functional validation, according to an embodiment.

FIG. 1 illustrates a first exemplary system 100 depicting a preliminary aspect of a method for generating address translation stimuli for post-silicon functional validation, according to an embodiment. At a preliminary phase of a post-silicon functional validation, prior to actual stimuli generation (e.g., validation testing with actual memory limitations for the DUT), a plurality of memory configurations 113 associated with a plurality of test templates 101 may be determined.

A plurality of test templates 101 may be provided to a simulation system 110 comprising a stimuli generator 111. The test templates may be designed to produce interesting events and may be a comprehensive set of test templates planned for the entire post-silicon validation cycle. The stimuli generator 111 may include a constraint satisfaction problem (CSP) solving engine (solver). During the preliminary phase, the CSP solver may be allowed to find solutions to the test templates without memory constraints, e.g., the actual memory limitations of the DUT during actual stimuli generation.

During the preliminary phase, various testing parameters may be provided to the stimuli generator 111, along with the plurality of test templates 101, including information associated with a DUT 102 (e.g., testing knowledge of the DUT) and information associated with the post-silicon testing environment 103 (e.g., testing environmental variables of the post-silicon staging, also known as the problem domain).

During the preliminary phase, the CSP solver (associated with the stimuli generator 111) may find solutions to the plurality of test templates 101 without any memory constraints. A memory manager (that may direct memory allocations during a stimuli generation phase, discussed below) may assume an "infinite" size of memory and allow the CSP solver to find solutions with no real memory limitation.

The CSP may use a plurality of translation tables to find solutions for the plurality of test templates 101. The plurality of translation tables may include different translation modes or types of translation tables. Data for the amount of entries used in the translation tables (for finding the solutions) may be collected, e.g., by simulation system 110. For example, the CSP solver may use a set of translation tables to find a particular solution. A number of entries used in each translation table (e.g., segment table, page table, radix tables) to obtain that solution may be counted. From the collected data, a memory distribution between the different types of translation tables used to obtain a solution may be calculated for each test template and translation mode. A plurality of memory distributions 112 may be determined for the plurality of test templates 101.

A ratio for the distribution of memory for the different translation tables (a translation table ratio) may be determined. A memory configuration may be determined to describe the translation table ratio for a particular test template. A memory configuration may be determined from a cluster of memory distributions. A plurality of memory configurations 113 may be determined for the plurality of memory distributions 112.

Different memory configurations may be grouped together based on similarities. Grouping similar memory configurations may create a smaller number of memory configurations to work with during a second phase of the post-silicon validation testing, e.g., a stimuli generation phase. The memory configurations may increase a probability to generate solutions for a particular problem domain.

Figure 2:
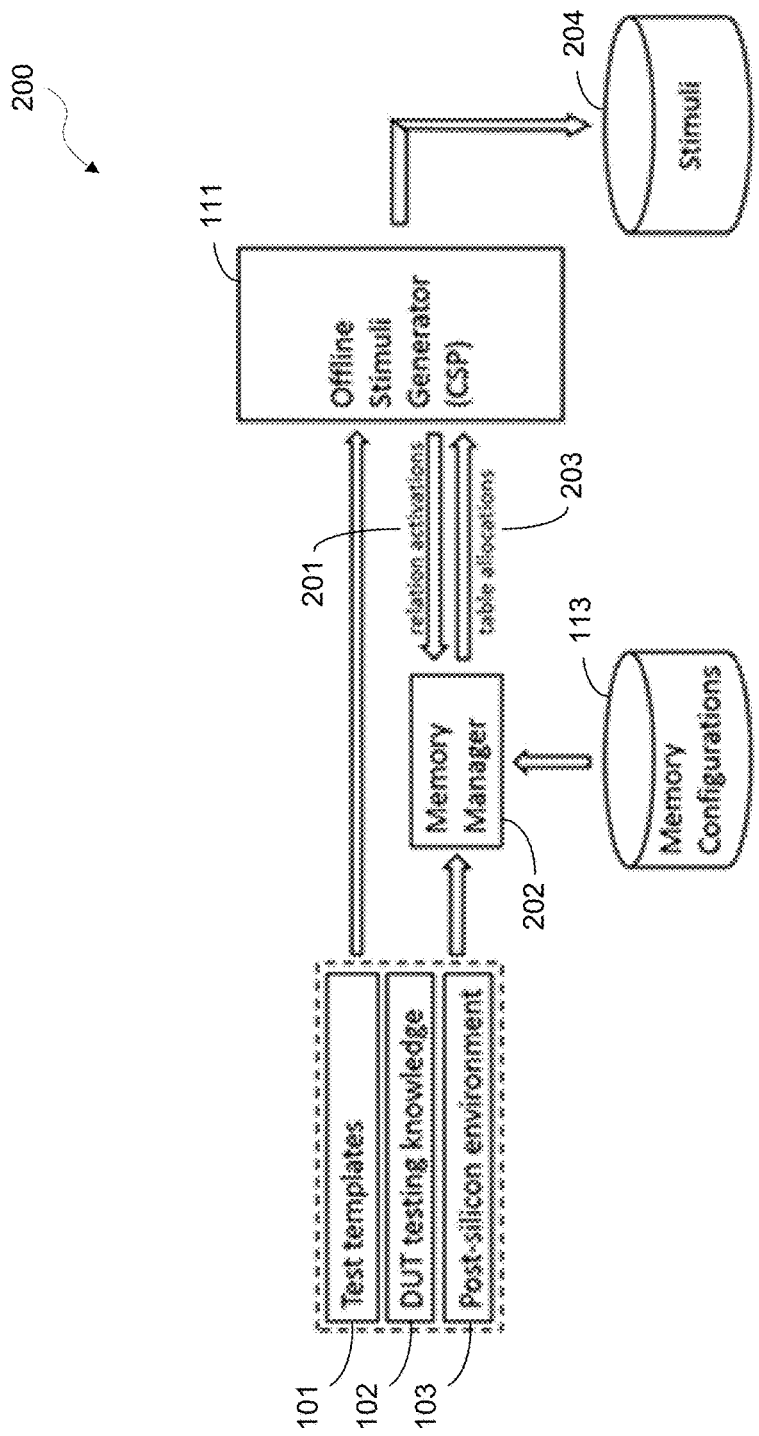
FIG. 2 is a block diagram illustrating an exemplary stimuli generation aspect of a method for generating address translation stimuli for post-silicon functional validation, according to an embodiment.

FIG. 2 illustrates a second exemplary system 200 depicting a stimuli generation aspect of a method for generating address translation stimuli for post-silicon functional validation, according to an embodiment. At a stimuli generation phase of the post-silicon functional validation, a stimuli 204 associated with a plurality of test templates 101 may be generated based, in part, on a plurality of memory configurations 113 determined during a preliminary phase of the post-silicon functional validation.

During the stimuli generation phase, stimuli generator 111 may create test scenarios for post-silicon validation. For each test template, the CSP solver (associated with the stimuli generator 111) may be invoked to solve the test template on the complete problem domain (i.e., including the actual memory available at the post-silicon staging).

A memory manager 202 (e.g., a dedicated, external memory manager, or memory management module) may identify a suitable (e.g., optimal) memory configuration (from the plurality of memory configurations 113 determined during the preliminary phase) to be used for each test template. During the CSP solving sequence, memory manager 202 may allocate translation tables according to the identified (e.g., suitable or optimal) memory configuration. Memory manager 202 may direct the CSP solver towards solutions in the problem domain, and may control attributes of the solutions that may be useful in terms of validation (e.g., sharing translation tables).

Stimuli generator 111 may receive a request to solve an address translation problem for a particular test template (from the plurality of test templates 101) in the problem domain. Based on the particular test template and the problem domain, memory manager 202 may select an appropriate (e.g., optimal) memory configuration (from the plurality of memory configurations 113 determined during the preliminary phase) to be utilized by the stimuli generator 111. For example, the selection of the appropriate memory configuration may be based on the particular test template, information associated with the DUT 102, and information associated with the post-silicon testing environment 103. In one embodiment, in contrast to the preliminary phase, the information associated with the post-silicon testing environment may include an amount of memory available during the post-silicon validation (e.g., the actual memory available at the post-silicon staging).

Memory manager 202 may provide an interface to the stimuli generator by which translation tables may be allocated in the memory space of the problem domain. The CSP solver (within stimuli generator 111) may build the constraints problem and invoke the solving sequence. The CSP solver may activate a relation (e.g., constraint) that involves an address within a predetermined translation table. During such relation activation, the CSP solver may call or request an allocation from memory manager 202. For example, the CSP solver may send relation activations 201 to memory manager 202 and memory manager 202 may send table allocations 203 to the CSP solver.

Memory manager 202 may identify the type of translation table for which allocation is requested (or required). According to the pre-selected memory configuration, memory manager 202 may determine the size (e.g., amount) of memory to allocate for the requested translation table. Memory manager 202 may search for available memory within the memory space of the problem domain. Memory manager 202 may provide the CSP solver (within stimuli generator 111) a designated memory slot for the requested translation table (e.g., table allocations 203). Stimuli generator 111 (using CSP solver and table allocations 203) may generate stimuli 204 based on a provided test template from the plurality of test templates 101.

In one embodiment, upon a first call (or request) from the CSP solver, memory manager 202 may allocate all the memory designated for the translation table. This may allow the CSP solver to search for solutions anywhere in the available memory space of the problem domain and may allow the CSP solver to generate translation solutions that may share table entries with each other.

Figure 3:
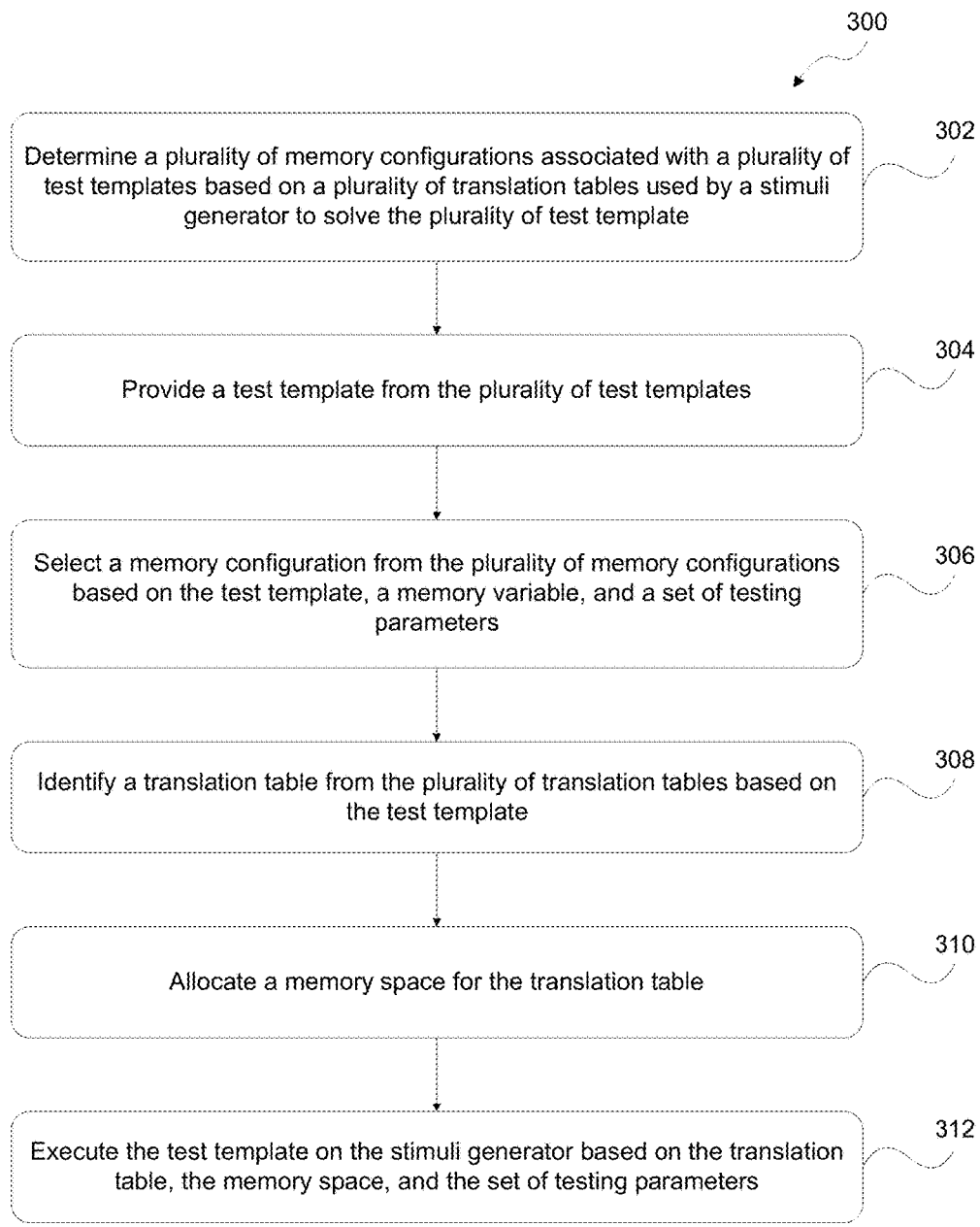
FIG. 3 is a flowchart illustrating a method for generating address translation stimuli for post-silicon functional validation, according to an embodiment.

FIG. 3 illustrates a first flowchart 300 depicting an exemplary method for generating address translation stimuli for post-silicon functional validation, according to an embodiment. At 302, a plurality of memory configurations associated with a plurality of test templates may be determined. The plurality of memory configurations may be determined based on a plurality of translation tables used by a stimuli generator to solve the plurality of test templates. The plurality of memory configurations may be determined during a preliminary phase of a post-silicon validation cycle. In one embodiment, the plurality of memory configurations may be determined without any memory constraints applied to a stimuli generator tasked with solving the plurality of test templates.

At 304, a test template from the plurality of test templates may be provided, e.g., to a stimuli generator. In one embodiment, a stimuli generator may execute the plurality of test templates in a preliminary phase of a post-silicon validation cycle (e.g., to determine a plurality of memory configurations) and during another phase of the post-silicon validation cycle, a test template from the plurality of test templates may be provided to the stimuli generator. A request to solve (e.g., find solutions for) the provided test template may also be provided, e.g., to the stimuli generator.

At 306, a memory configuration from the plurality of memory configurations may be selected based on the test template, the memory variable, and a set of testing parameters. The test template may be a test template selected from the plurality of test templates executed on the stimuli generator during the preliminary phase of the post-silicon validation cycle. The selected memory configuration may be a suitable or appropriate memory configuration for solving the provided test template. In one embodiment, the selected memory configuration is an optimal memory configuration for solving the provided test template. Suitability and appropriateness of a memory configuration may be based on a predetermined level of efficiency and/or other variable, e.g., speed, resource or memory consumption, etc. An optimal memory configuration may represent a suitable or appropriate memory configuration with a maximum level of performance, e.g., efficiency and/or other variable, e.g., speed, resource or memory consumption, etc.

The memory variable may be based on an amount of memory available during post-silicon validation. The problem domain may include the amount of memory available to a CSP solver to find solutions to various test templates. The amount of memory available may be dependent on the DUT.

The set of testing parameters may include information associated with a DUT (e.g., testing knowledge of the DUT) and information associated with the post-silicon testing environment (e.g., testing environmental variables of the post-silicon staging, also known as the problem domain).

In one embodiment, the selection of the memory configuration may be performed by a memory manager, e.g., a dedicated, external memory manager. The memory manager may be external to (or separate from) the stimuli generator. The memory manager may be a separate device or one or more program modules with dedicated processing and memory resources, which may be partially or completely separate from resources consumed by the stimuli generator.

At 308, a translation table from the plurality of translation tables may be identified based on the test template. The translation table may be a translation table used by the stimuli generator (and CSP solver) to solve the plurality of test templates during the preliminary phase of the post-silicon validation cycle. The identification of the translation table may be by the CSP solver, e.g., by activating a relation (e.g., constraint) during solving sequence. The identification of the translation table may be by the memory manager, e.g., in response to receiving a relation (e.g., constraint) activation from the CSP solver.

At 310, a memory space for the translation table, i.e., the identified translation table, may be allocated. The memory space may be allocated based on the selected memory configuration.

At 312, the test template may be executed on the stimuli generator based on the translation table, the memory space, and the set of testing parameters. In one embodiment, the stimuli generator may output a stimuli based on the test template.

Figure 4:
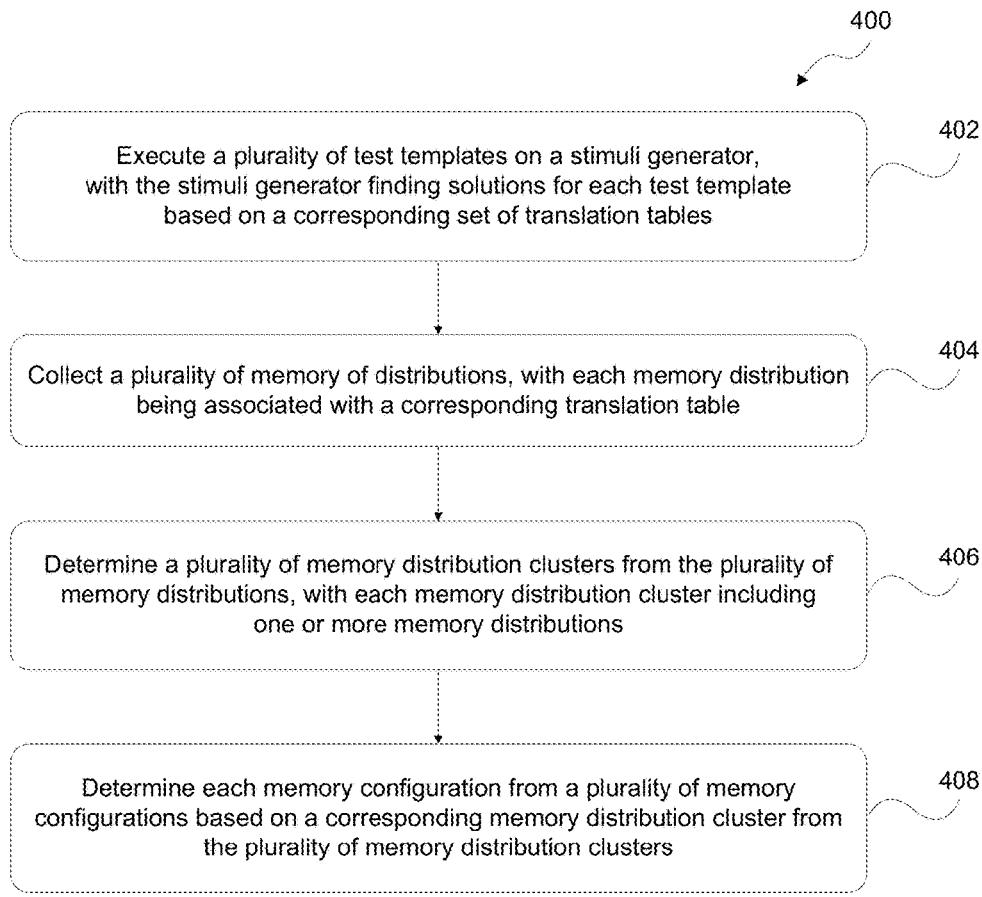
FIG. 4 is a flowchart illustrating an exemplary preliminary aspect of a method for generating address translation stimuli for post-silicon functional validation, according to an embodiment.

FIG. 4 illustrates a second flowchart 400 depicting an exemplary preliminary aspect of a method for generating address translation stimuli for post-silicon functional validation, according to an embodiment. At 402, a plurality of test templates may be executed on the stimuli generator, with the stimuli generator finding solutions for each test template based on a corresponding set of translation tables. During a preliminary phase of a post-silicon validation cycle, a plurality of test templates may be provided to a simulation system, which may include a stimuli generator that may be used during another phase of a post-silicon validation cycle. In one embodiment, during a preliminary phase, a plurality of test templates may be executed on a stimuli generator without limitations (e.g., constraints) that may be subsequently applied to the stimuli generator during another phase of post-silicon validation testing.

At 404, a plurality of memory distributions may be collected, e.g., during or after the plurality of test templates are executed on the stimuli generator. Each memory distribution from the plurality of memory distributions may be associated with a corresponding translation table from the plurality of translation tables used by the stimuli generator to solve the plurality of test templates.

The collection of memory distributions may include collecting memory data associated with each corresponding translation table and determining a memory distribution, e.g., a ratio for the distribution of memory used for different translation tables. For each solution obtained (from the CSP solver), the number of entries used in each of the translation tables may be counted.

At 406, a plurality of memory distribution clusters may be determined from the plurality of memory distributions. Each memory distribution cluster may include one or more memory distributions.

At 408, each memory configuration from the plurality of memory configurations may be determined based on a corresponding memory distribution cluster from the plurality of memory distribution clusters.

In one embodiment, the plurality of memory configurations is further based on the set of testing parameters. For example, the set of testing parameters applied during the stimuli generation phase of the post-silicon validation cycle may also be applied during the preliminary phase.

In one embodiment, the set of testing parameters is based on at least one of information associated with a device under testing (DUT) and information associated with the post-silicon testing environment.

In one embodiment, determining the plurality of memory configurations is performed without any memory constraints. For example, the stimuli generator may not be given any memory constraints, e.g., during a preliminary phase of a post-silicon validation cycle.

In one embodiment, the memory variable is based on an amount of memory available during post-silicon validation. For example, the memory variable may be based on the problem domain, e.g., the amount of space available at the post-silicon test bench for the DUT.

In one embodiment, the method may further include providing a memory management module, and selecting the memory configuration from the plurality of memory configurations is performed by the memory management module. For example, the memory management module may be a dedicated, external memory manager that may be external from the stimuli generator.

In one embodiment, the stimuli generator includes a constraint satisfaction problem (CSP) solving engine.

In one embodiment, the method further includes providing an exerciser and the exerciser includes the stimuli generator. In another embodiment, the stimuli generator is an offline stimuli generator.

In an alternative embodiment, another exemplary method for generating address translation stimuli for post-silicon functional validation is provided. The method may include a preliminary testing phase and a stimuli generation phase. The preliminary testing phase may include determining, without applying a memory constraint, a plurality of memory configurations associated with a plurality of test templates based on a plurality of translation tables used by a stimuli generator to solve the plurality of test templates. The stimuli generation phase may include executing on the stimuli generator, with applying the memory constraint, a test template from the plurality of test templates based on a memory configuration selected from the plurality of memory configurations based on the test template and the memory constraint.

Embodiments disclosed and contemplated herein may be implemented and performed on a computing node, e.g., disclosed herein.

Figure 5:
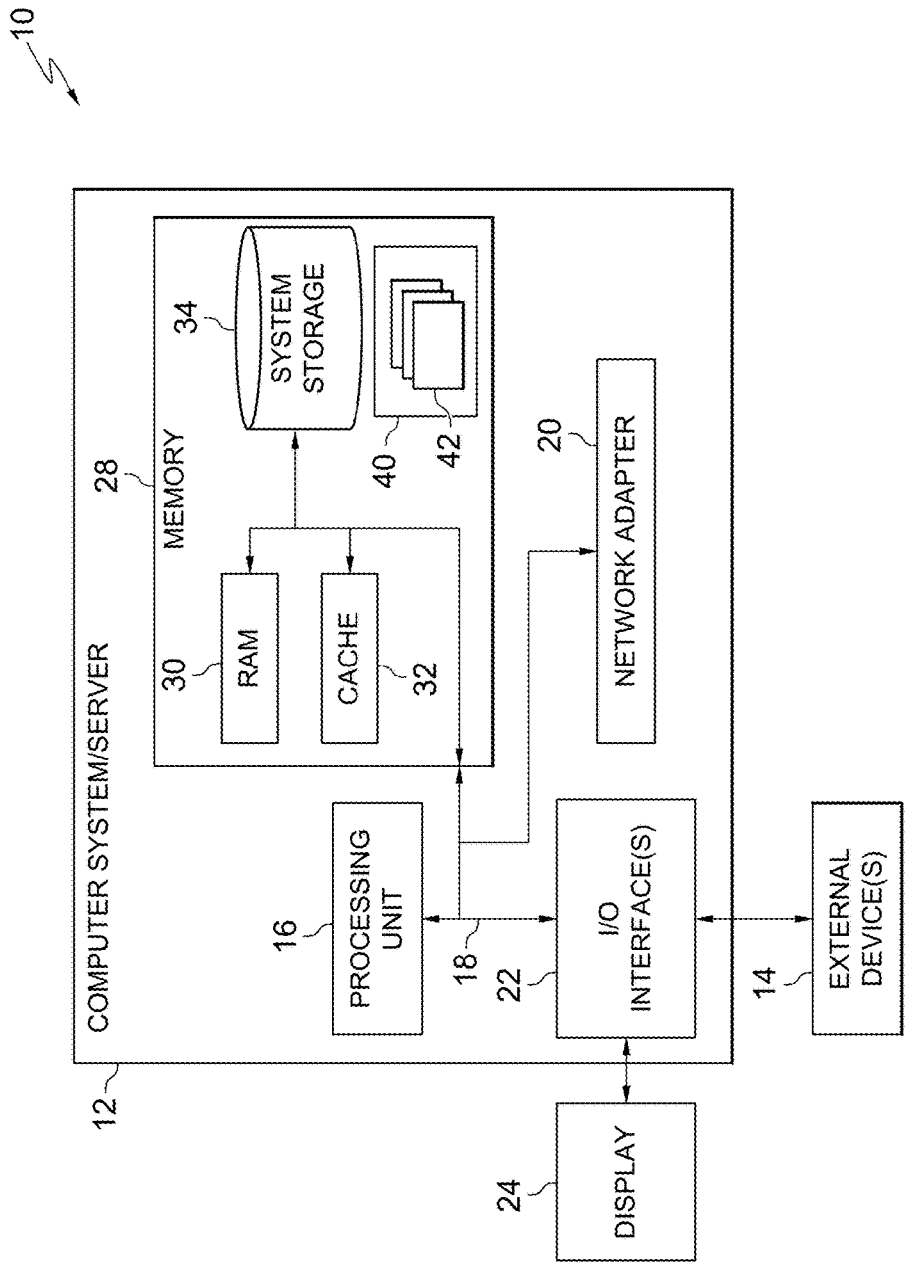
FIG. 5 is a block diagram illustrating a computing node, according to an aspect of the invention.

FIG. 5 depicts a schematic illustrating an example of a computing node. Computing node 10 is only one example of a suitable computing node and is not intended to suggest any limitation as to the scope of use or functionality of embodiments of the invention described herein. Regardless, computing node 10 is capable of being implemented and/or performing any of the functionality set forth hereinabove.

In computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed computing environments that include any of the above systems or devices, and the like.

Computer system/server 12 may be described in the general context of computer system-executable instructions, such as program modules, being executed by a computer system. Generally, program modules may include routines, programs, objects, components, logic, data structures, and so on that perform particular tasks or implement particular abstract data types. Computer system/server 12 may be practiced in distributed computing environments where tasks are performed by remote processing devices that are linked through a communications network. In a distributed computing environment, program modules may be located in both local and remote computer system storage media including memory storage devices.

As shown in FIG. 5, computer system/server 12 in computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, external disk drive arrays, RAID systems, tape drives, and data archival storage systems, etc.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method for post-silicon validation, the method comprising:
   receiving a plurality of test templates, wherein the received plurality of test templates are used for a device under testing (DUT);
   creating a set of memory configurations for a desired distribution of a plurality of translation tables based on the received plurality of test templates;
   collecting, by a memory manager, a plurality of data from the plurality of translation tables for each test template;
   populating the created set of memory configurations with the collected plurality of data;
   constructing a memory distribution ratio for each translation table based on the collected plurality of data;
   creating, by the memory manager, a memory configuration to describe the constructed memory distribution ratio for each test template;
   combining the created memory configuration for each test template into a clustered plurality of memory configurations;
   providing the plurality of test templates to a stimuli generator based on the combined clustered plurality of memory configurations;
   identifying, by the memory manager, a most suitable memory configuration for each test template; and
   generating a test stimuli and an associated translation table for each test template using the most suitable memory configuration.

2. The method of claim 1, wherein the created set of memory configurations are created by considering the plurality of test templates, a testing knowledge of the DUT and a post-silicon environmental variable, wherein the post-silicon environmental variable is a problem domain.

3. The method of claim 1, wherein the plurality of translation tables includes a plurality of translation data that translates a memory address using a predetermined memory configuration associated with a particular test template.

4. The method of claim 1, wherein the plurality of memory configurations has more than one memory configuration for each test template, and wherein the plurality of memory configurations are executed without a memory constraint.

5. The method of claim 1, wherein the most suitable memory configuration is based on an amount of memory available on a DUT during post-silicon validation.

6. The method of claim 1, wherein the plurality of data provides, for each testing template and each translation table, a memory distribution for each type of translation table that is used to accommodate a solution, and wherein the solution is provided by a constrain satisfaction problem (CSP) solving engine.

7. The method of claim 1, wherein the memory manager allocates translation table data according to a constrain satisfaction problem (CSP) solving engine solving sequence, wherein the memory manager directs the CSP solver to solve specific problem domains.

8. A computer system for post-silicon validation, comprising:
one or more processors, one or more computer-readable memories, one or more computer-readable tangible storage medium, and program instructions stored on at least one of the one or more tangible storage medium for execution by at least one of the one or more processors via at least one of the one or more memories, wherein the computer system is capable of performing a method comprising:
receiving a plurality of test templates, wherein the received plurality of test templates are used for a device under testing (DUT);
creating a set of memory configurations for a desired distribution of a plurality of translation tables based on the received plurality of test templates;
collecting, by a memory manager, a plurality of data from the plurality of translation tables for each test template;
populating the created set of memory configurations with the collected plurality of data;
constructing a memory distribution ratio for each translation table based on the collected plurality of data;
creating, by the memory manager, a memory configuration to describe the constructed memory distribution ratio for each test template;
combining the created memory configuration for each test template into a clustered plurality of memory configurations;
providing the plurality of test templates to a stimuli generator based on the combined clustered plurality of memory configurations;
identifying, by the memory manager, a most suitable memory configuration for each test template; and
generating a test stimuli and an associated translation table for each test template using the most suitable memory configuration.

9. The computer system of claim 8, wherein the created set of memory configurations are created by considering the plurality of test templates, a testing knowledge of the DUT and a post-silicon environmental variable, wherein the post-silicon environmental variable is a problem domain.

10. The computer system of claim 8, wherein the plurality of translation tables includes a plurality of translation data that translates a memory address using a predetermined memory configuration associated with a particular test template.

11. The computer system of claim 8, wherein the plurality of memory configurations has more than one memory configuration for each test template, and wherein the plurality of memory configurations are executed without a memory constraint.

12. The computer system of claim 8, wherein the most suitable memory configuration is based on an amount of memory available on a DUT during post-silicon validation.

13. The computer system of claim 8, wherein the plurality of data provides, for each testing template and each translation table, a memory distribution for each type of translation table that is used to accommodate a solution, and wherein the solution is provided by a constrain satisfaction problem (CSP) solving engine.

14. The computer system of claim 8, wherein the memory manager allocates translation table data according to a constrain satisfaction problem (CSP) solving engine solving sequence, wherein the memory manager directs the CSP solver to solve specific problem domains.

15. A computer program product for post-silicon validation, comprising:
one or more computer-readable storage media and program instructions stored on at least one of the one or more tangible storage media, the program instructions executable by a processor to cause the processor to perform a method comprising:
receiving a plurality of test templates, wherein the received plurality of test templates are used for a device under testing (DUT);
creating a set of memory configurations for a desired distribution of a plurality of translation tables based on the received plurality of test templates;
collecting, by a memory manager, a plurality of data from the plurality of translation tables for each test template;
populating the created set of memory configurations with the collected plurality of data;
constructing a memory distribution ratio for each translation table based on the collected plurality of data;
creating, by the memory manager, a memory configuration to describe the constructed memory distribution ratio for each test template;
combining the created memory configuration for each test template into a clustered plurality of memory configurations;
providing the plurality of test templates to a stimuli generator based on the combined clustered plurality of memory configurations;
identifying, by the memory manager, a most suitable memory configuration for each test template; and
generating a test stimuli and an associated translation table for each test template using the most suitable memory configuration.

16. The computer program product of claim 15, wherein the created set of memory configurations are created by considering the plurality of test templates, a testing knowledge of the DUT and a post-silicon environmental variable, wherein the post-silicon environmental variable is a problem domain.

17. The computer program product of claim 15, wherein the plurality of translation tables includes a plurality of translation data that translates a memory address using a predetermined memory configuration associated with a particular test template.

18. The computer program product of claim 15, wherein the plurality of memory configurations has more than one memory configuration for each test template, and wherein the plurality of memory configurations are executed without a memory constraint.

19. The computer program product of claim 15, wherein the most suitable memory configuration is based on an amount of memory available on a DUT during post-silicon validation.

20. The computer program product of claim 15, wherein the plurality of data provides, for each testing template and each translation table, a memory distribution for each type of translation table that is used to accommodate a solution, and wherein the solution is provided by a constrain satisfaction problem (CSP) solving engine.

* * * * *